(12) United States Patent
Brown, Jr. et al.

(10) Patent No.: US 12,068,724 B2
(45) Date of Patent: Aug. 20, 2024

(54) RADIO FREQUENCY PHASE SHIFTER WITH VARIABLE INPUT CAPACITANCE

(71) Applicant: QUALCOMM Incorporated, San Diego, CA (US)

(72) Inventors: Gary Lee Brown, Jr., Carlsbad, CA (US); Chirag Dipak Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 517 days.

(21) Appl. No.: 17/403,595

(22) Filed: Aug. 16, 2021

(65) Prior Publication Data

US 2023/0048770 A1    Feb. 16, 2023

(51) Int. Cl.
*H03F 3/14*    (2006.01)
*H03F 1/22*    (2006.01)
(Continued)

(52) U.S. Cl.
CPC ............. *H03F 3/195* (2013.01); *H03F 1/223* (2013.01); *H03H 7/20* (2013.01); *H03H 7/38* (2013.01); *H03F 2200/204* (2013.01)

(58) Field of Classification Search
CPC .... H03F 3/195; H03F 1/223; H03F 2200/204; H03F 1/086; H03F 1/56; H03F 3/45089;
(Continued)

(56) References Cited

U.S. PATENT DOCUMENTS

| | | | |
|---|---|---|---|
| 6,297,696 B1* | 10/2001 | Abdollahian | H03F 3/602 375/238 |
| 7,365,606 B2* | 4/2008 | Heymann | H03F 3/45183 330/307 |

(Continued)

OTHER PUBLICATIONS

Elkhouly M., et al., "220 250-GHz Phased-Array Circuits in 0.13-$\mu\hbox{m}$ SiGe BiCMOS Technology", IEEE Transactions on Microwave Theory and Techniques, IEEE, USA, vol. 61, No. 8, Aug. 2, 2013, pp. 3115-3127, XP011522380, ISSN: 0018-9480, DOI: 10.1109/TMTT.2013.2258032, p. 3117, left-hand column, paragraph 1-p. 3123, left-hand column, paragraph 1, figures 7, 16, 14.

(Continued)

*Primary Examiner* — Khanh V Nguyen
(74) *Attorney, Agent, or Firm* — Loza & Loza, LLP/Qualcomm Incorporated

(57) ABSTRACT

Aspects of the disclosure relate to a radio frequency phase shifter. An example includes an amplification stage to produce an amplified voltage, the amplification stage having a first amplifier with a first input coupled to a first output of a hybrid coupler and a second amplifier with a complementary second input coupled to a complementary second output of the hybrid coupler. A vector modulation stage coupled to the amplification stage receives the amplified voltage and produces a modulated vector, the vector modulation stage has an in-phase section and a quadrature section to control the phase of the modulated vector in response to a phase control signal. A varactor coupled across the first input and the (Continued)

second input of the amplification stage adjusts the capacitance between the first input and the second input in response to a capacitance control signal.

19 Claims, 11 Drawing Sheets

(51) Int. Cl.
*H03F 3/195* (2006.01)
*H03H 7/20* (2006.01)
*H03H 7/38* (2006.01)

(58) Field of Classification Search
CPC ......... H03F 2200/541; H03F 2200/213; H03F 2200/546; H03F 1/0294; H03F 2200/192; H03F 2200/294; H03F 2203/45228; H03F 2203/45318; H03F 2203/45394; H03F 1/3294; H03F 3/193; H03F 1/3288; H03H 7/20; H03H 7/38; H03G 1/0023
See application file for complete search history.

(56) References Cited

U.S. PATENT DOCUMENTS

| | | | |
|---|---|---|---|
| 8,781,595 B2* | 7/2014 | Grevious | G08C 17/02 330/10 |
| 2009/0074407 A1* | 3/2009 | Hornbuckle | H04B 10/5561 398/43 |

OTHER PUBLICATIONS

International Search Report and Written Opinion—PCT/US2022/038391—ISA/EPO—Nov. 17, 2022.
Nayu L., et al., "A 4-Element 7.5-9 GHz Phased Array Receiver with 8 Simultaneously Reconfigurable Beams in 65 nm CMOS Technology", 2020 IEEE Radio Frequency Integrated Circuits Symposium (RFIC), IEEE, Aug. 4, 2020, pp. 83-86, XP033838349, DOI: 10.1109/RFIC49505.2020.9218299 [retrieved on Oct. 8, 2020] p. 83, right-hand column, paragraph 3-p. 85, right-hand column, paragraph 1, figures 1-4.

* cited by examiner

RADIO FREQUENCY PHASE SHIFTER WITH VARIABLE INPUT CAPACITANCE

FIELD

Aspects of the present disclosure relate generally to a radio frequency phase shifter in a radio transceiver, and in particular, to a phase shifter with a variable input capacitance.

DESCRIPTION OF RELATED ART

Wireless communication devices and technologies are becoming ever more prevalent. Wireless communication devices generally transmit and receive communication signals. A communication signal is typically processed by a variety of different components and circuits. In some modern communication systems, a communication beam may be formed and steered in one or more directions. Multiple antenna elements of a single antenna array are used to steer the beam by adjusting the relative phase between the signals emitted by each element. A phase shifter between the signal source and each antenna element allows the phase to be modified interdependently at each antenna. In a similar way phase shifters between each antenna element and a receiver allow radio received signals to be isolated from other signals and interference.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. An example includes an amplification stage to produce an amplified voltage, the amplification stage having a first amplifier with a first input coupled to a first output of a hybrid coupler and a second amplifier with a complementary second input coupled to a complementary second output of the hybrid coupler. A vector modulation stage coupled to the amplification stage receives the amplified voltage and produces a modulated vector, the vector modulation stage has an in-phase section and a quadrature section to control the phase of the modulated vector in response to a phase control signal. A varactor coupled across the first input and the second input of the amplification stage adjusts the capacitance between the first input and the second input in response to a capacitance control signal.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Radio frequency (RF) phase shifters are used in transmitters and receivers to introduce small phase differences across different elements of a phased array antenna. It is common for a vector modulator that includes RF phase shifters to sum two phase shifted I/Q (in-phase/quadrature) vectors together for a constant amplitude with controlled and modulated phase. The inefficiency is increased under circumstances when the antenna element is disabled and power is still provided to maintain the constant impedance. As described herein, a varactor may be used at the signal input of a vector modulator to improve efficiency. The capacitance of the varactor may be adjusted to give a constant impedance across a range of different phase settings. An additional cascode may be stacked over the vector modulator to reduce the output capacitance. This may provide for a higher available gain at high frequencies. These techniques may be used in a transmitter or receiver or both.

Figure 1:
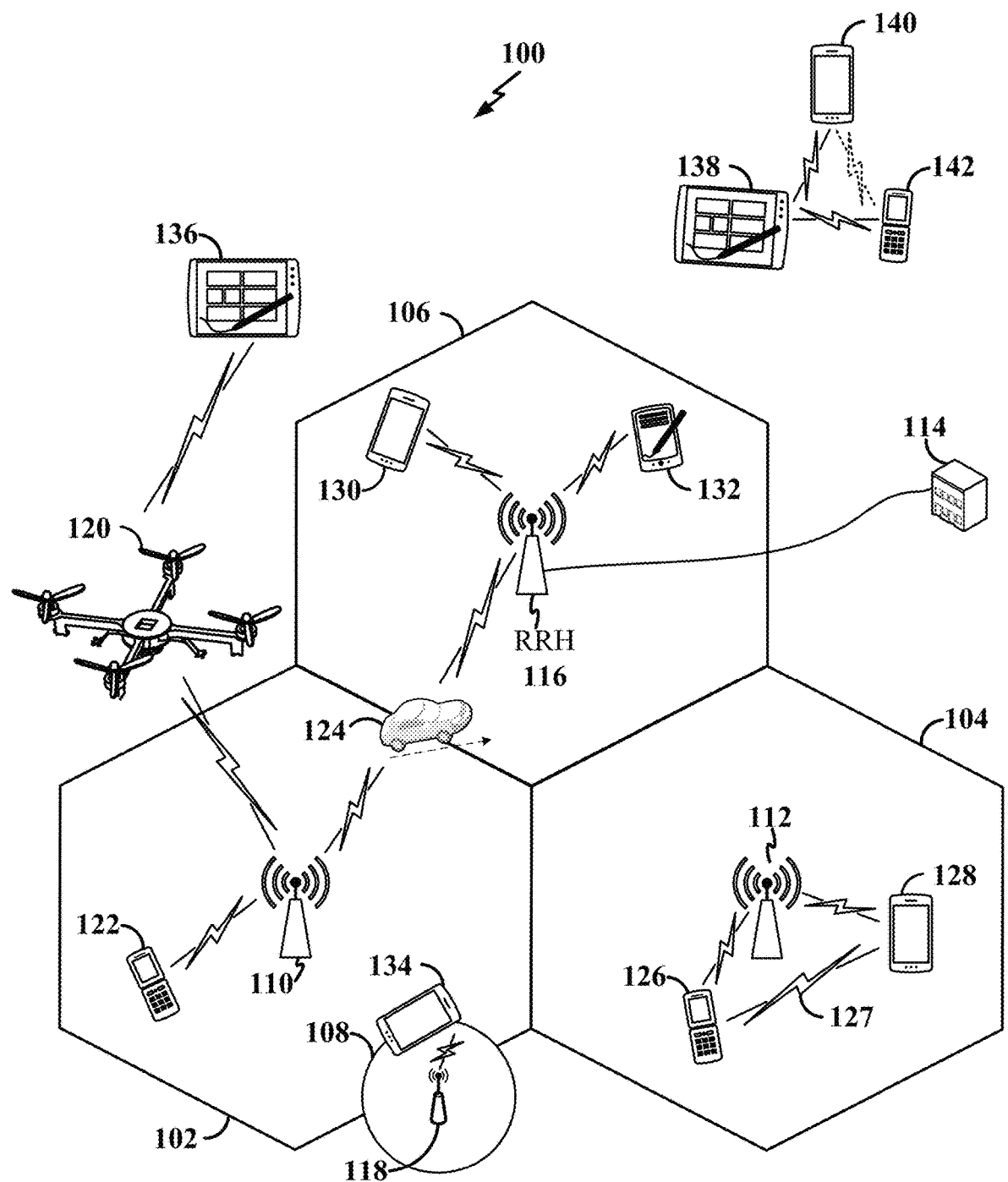
FIG. 1 illustrates a schematic diagram of a wireless device communicating with a wireless communication system in accordance with an aspect of the disclosure.

The various concepts presented throughout this disclosure may be implemented across a broad variety of telecommunication systems, network architectures, and communication standards. Referring now to FIG. 1, as an illustrative example without limitation, a schematic illustration of a radio access network (RAN) 100 is provided. The RAN 100 may implement any suitable wireless communication technology or technologies to provide radio access. As one example, the RAN 100 may operate according to $3^{rd}$ Generation Partnership Project (3GPP) New Radio (NR) specifications, often referred to as 5G. As another example, the RAN 100 may operate under a hybrid of 5G NR and Evolved Universal Terrestrial Radio Access Network (eU-TRAN) standards, often referred to as Long Term Evolution (LTE). The 3GPP refers to this hybrid RAN as a nextgeneration RAN, or NG-RAN. Of course, many other examples may be utilized within the scope of the present disclosure.

The geographic region covered by the radio access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB) or some other suitable terminology.

In FIG. 1, a first base station 110 is shown in a first cell 102. A second base station 112 is shown in a second cell 104; and a third base station 114 is shown controlling a remote radio head (RRH) 116 in a third cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the small cell 108 (e.g., a microcell, picocell, femtocell, home base station, home Node B, home eNode B, etc.) which may overlap with one or more macrocells. The base stations 110, 112, 114, 118 provide wireless access points to a core network for any number of mobile apparatuses.

FIG. 1 further includes a mobile base station 120 in the form of a quadcopter or drone, which may be configured to function as a base station. That is, in some examples, a cell may not necessarily be stationary, and the geographic area of the cell may move according to the location of a mobile base station 120 such as the quadcopter.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quadcopter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Within the RAN 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with base station 118; and UE 136 may be in communication with mobile base station 120. Here, each base station 110, 112, 114, 118, and 120 may be configured to provide an access point to a core network (not shown) for all the UEs in the respective cells.

In another example, a mobile network node (e.g., a quadcopter) may be configured to function as a UE. For example, the quadcopter may operate within cell 102 by communicating with base station 110. In some aspects of the present disclosure, two or more UE (e.g., UEs 126 and 128) may communicate with each other using peer to peer (P2P) or sidelink signals 127 without relaying that communication through a base station (e.g., base station 112).

Wireless communication between a RAN 100 and a UE (e.g., UE 122 or 124) may be described as utilizing an air interface. Transmissions over the air interface from a base station (e.g., base station 110) to one or more UEs (e.g., UE 122 and 124) may be referred to as downlink (DL) transmission. In accordance with certain aspects of the present disclosure, the term downlink may refer to a point-to-multipoint transmission originating at a scheduling entity (described further below; e.g., base station 110). Another way to describe this scheme may be to use the term broadcast channel multiplexing. Transmissions from a UE (e.g., UE 122) to a base station (e.g., base station 110) may be referred to as uplink (UL) transmissions. In accordance with further aspects of the present disclosure, the term uplink may refer to a point-to-point transmission originating at a scheduled entity (described further below; e.g., UE 122).

For example, DL transmissions may include unicast or broadcast transmissions of control information and/or traffic information (e.g., user data traffic) from a base station (e.g., base station 110) to one or more UEs (e.g., UEs 122 and 124), while UL transmissions may include transmissions of control information and/or traffic information originating at a UE (e.g., UE 122). In addition, the uplink and/or downlink control information and/or traffic information may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
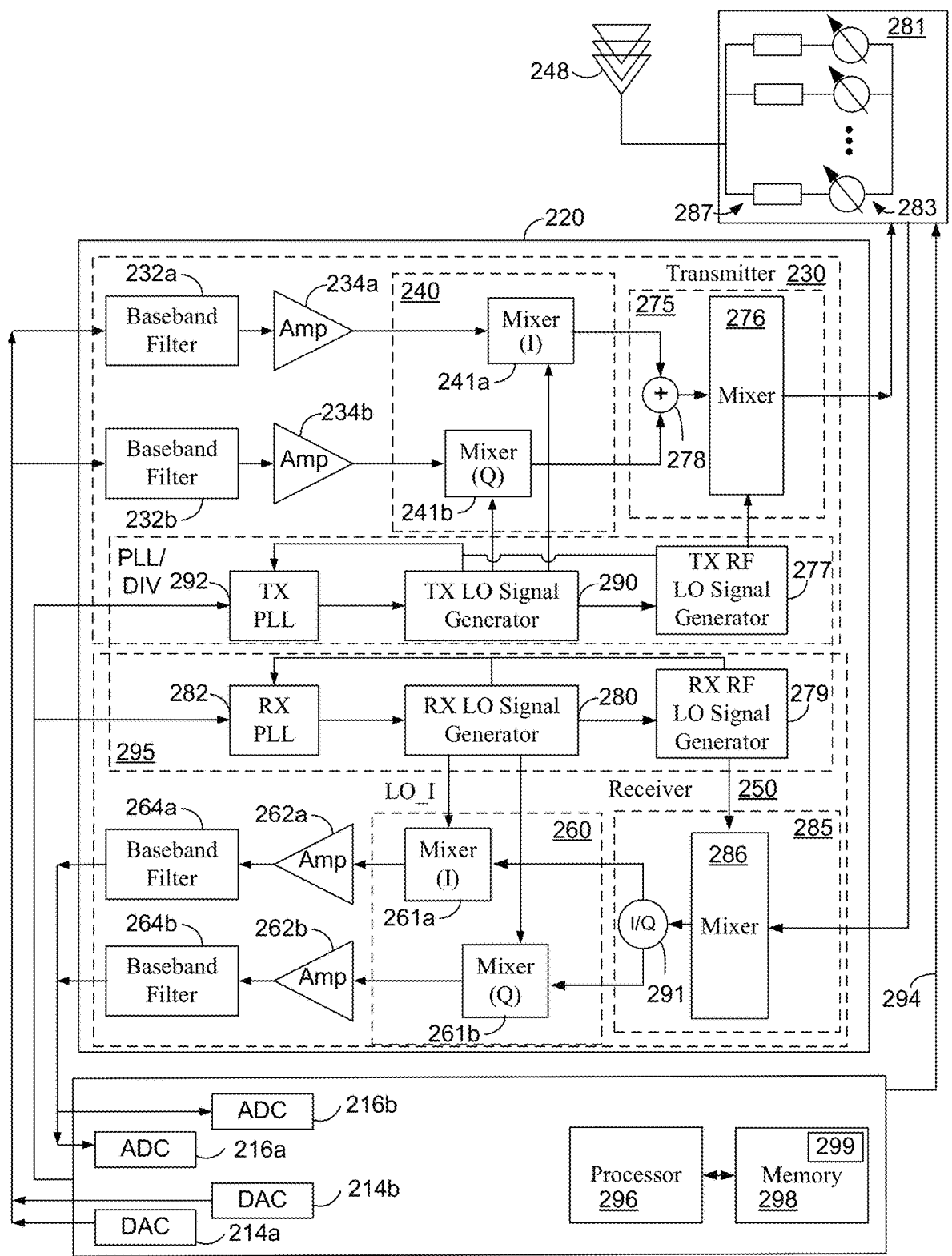
FIG. 2 illustrates a block diagram showing a wireless device in accordance with another aspect of the disclosure.

FIG. 2 is a block diagram showing a wireless device 200 in which the exemplary techniques of the present disclosure may be implemented. The wireless device 200 may, for example, be an embodiment of any of the wireless devices illustrated in FIG. 1. FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, the wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The transceiver 220 includes a transmitter 230 and a receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency ICs (RFICs), mixed-signal ICs, etc.

In the transmit path, the data processor 210 processes data to be transmitted and provides in-phase (I) and quadrature (Q) analog output signals to the transmitter 230. In some embodiments, the data processor 210 includes a first digital-to-analog-converter (DAC) 214*a* and a second DAC 214*b* for converting digital signals generated by the data processor 210 into the I and Q analog output signals, e.g., I and Q output currents, for further processing. In other embodiments, the first DAC 214*a* and the second DAC 214*b* are included in the transceiver 220 and the data processor 210 provides data (e.g., for I and Q) to the transceiver 220 digitally.

Within the transmitter 230, lowpass filters 232*a* and 232*b* filter the I and Q analog transmit signals, respectively, to remove undesired images caused by the prior digital-to-analog conversion. Amplifiers (Amp) 234*a* and 234*b* amplify the signals from lowpass filters 232*a* and 232*b*, respectively, and provide I and Q baseband signals. An upconverter 240 having upconversion mixers 241*a* and 241*b* upconverts the I and Q baseband signals with I and Q transmit (TX) local oscillator (LO) signals from a TX LO signal generator 290 and provides an upconverted signal.

The upconverter 240 and a downconverter 260 are configured to process a communication signal between baseband and an intermediate frequency (IF). For example, the upconverter 240 may be configured to provide an IF signal to an upconverter 275. In some embodiments, the upconverter 275 may comprise a summing function 278 and upconversion mixer 276. The summing function 278 combines the I and the Q outputs of the upconverter 240 and provides a non-quadrature signal to the upconversion mixer 276. The non-quadrature signal may be single ended or differential. The upconversion mixer 276 is configured to receive the IF signal from the upconverter 240 and TX RF LO signals from a TX RF LO signal generator 277, and provide an upconverted RF signal to phase shift circuitry 281. A phase locked loop (PLL) 292 is illustrated in FIG. 2 as being shared by the RX RF LO signal generator 279 and TX RF LO signal generator 277. Alternatively, a PLL for each respective signal generator may be implemented.

In some embodiments, components in the phase shift circuitry 281 may comprise one or more adjustable or variable phased array elements, and may receive one or more control signals from the data processor 210 over the connection 294 and operate the adjustable or variable phased array elements based on the received control signals. In some embodiments, the phase shift circuitry 281 comprises phase shifters 283 and phased array elements 287. Although three phase shifters 283 and three phased array elements 287 are shown for ease of illustration, the phase shift circuitry 281 may comprise more or fewer of the phase shifters 283 and the phased array elements 287.

Each of the phase shifters 283 may be configured to receive the RF transmit signal from the upconverter 275, alter the phase by an amount, and provide the RF signal to a respective on of the phased array elements 287. Each of the phased array elements 287 may comprise transmit and receive circuitry including one or more filters, amplifiers, driver amplifiers, and power amplifiers. In some embodiments, the phase shifters 283 may be incorporated within respective phased array elements 287.

The output of the phase shift circuitry 281 is provided to an antenna array 248. In some embodiments, the antenna array 248 comprises a number of antennas that typically correspond to the number of phase shifters 283 and phased array elements 287, for example such that each antenna element is coupled to a respective one of the phased array elements 287. In some embodiments, the phase shift circuitry 281 and the antenna array 248 may be referred to as a phased array.

In a receive direction, an output of the phase shift circuitry 281 is provided to a downconverter 285. In some embodiments, the downconverter 285 may comprise an I/Q generation function 291 and a downconversion mixer 286. In some embodiments, the downconversion mixer 286 downconverts the receive RF signal provided by the phase shift circuitry 281 to an IF signal according to RX RF LO signals provided by an RX RF LO signal generator 279. The I/Q generation function 291 receives the IF signal from the downconversion mixer 286 and generates I and Q signals for the downconverter 260, which downconverts the IF signals to baseband.

The I and Q baseband signals are amplified by amplifiers 262a and 262b and further filtered by lowpass filters 264a and 264b to obtain I and Q analog input signals, which are provided to the data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2, the TX LO signal generator 290 generates the I and Q TX LO signals used for frequency upconversion, while the RX LO signal generator 280 generates the I and Q RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from TX LO signal generator 290. Similarly, a RX PLL 282 receives timing information from the data processor 210 and generates a control signal used to adjust the frequency and/or phase of the RX LO signals from RX LO signal generator 280.

Certain components of the transceiver 220 are functionally illustrated in FIG. 2, and the configuration illustrated therein may or may not be representative of a physical device configuration in certain implementations. For example, as described above, the transceiver 220 may be implemented in various integrated circuits (ICs), RF ICs, mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In some embodiments, filters, power amplifiers, and amplifiers may be implemented separately from other components in the transmitter 230 and receiver 250, and may be implemented on a millimeter wave integrated circuit.

Figure 3:
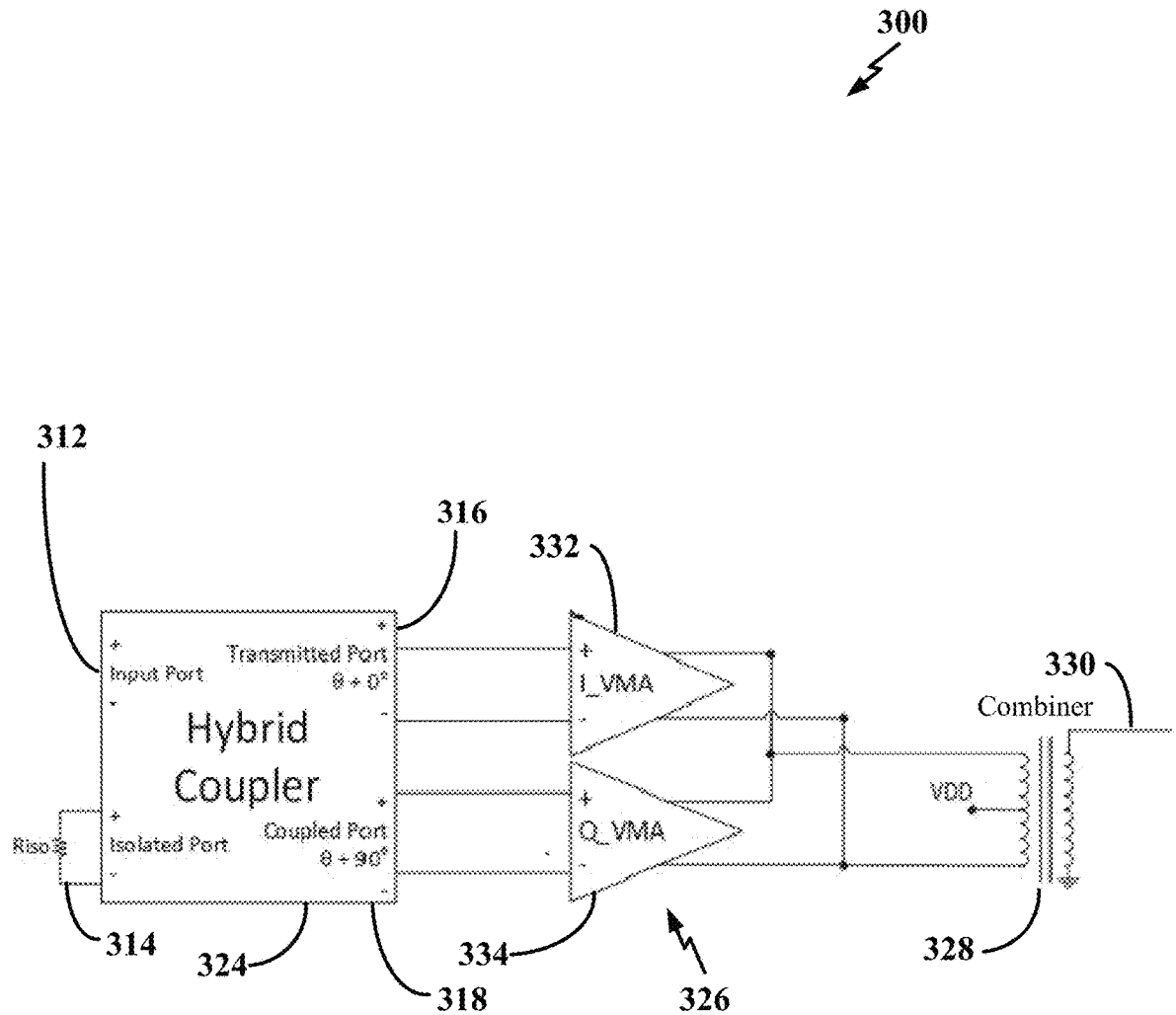
FIG. 3 illustrates a circuit diagram of a phase shifter in accordance with another aspect of the disclosure.

FIG. 3 is a diagram of a phase shifter, e.g. the phase shift circuitry 281, in more detail. While the phase shifter is described as a receive phase shifter coupled between an antenna array 248 and a downconverter 285. The structure may be modified for use also or alternatively as a transmit phase shifter. The phase shifter 300 includes a hybrid coupler 324, e.g., an asymmetrical quadrature hybrid coupler, that is directly connected to a vector modulator 326 that is coupled to a coupling circuit 328 that couples the phase shifted signal to an output port 330. In the depicted configuration, the phase shifter 300 is implemented as a unidirectional phase shifter, although the same or similar structures may be applied to a bidirectional phase shifter. During a receive operation, an input port 312 of the hybrid coupler 324 receives a signal to be shifted from a particular antenna element. The phase of the signal is shifted and coupled through the coupling circuit 328 to the output port 330 which is coupled to a downconverter. Alternatively, during a transmit operation, the output port 330 is coupled to the antenna element to transmit a data signal.

In the depicted configuration, the input port 312 of the hybrid coupler 324 is connected through a transmitted port 316 of the hybrid coupler to a first vector modulator amplifier (VMA) 332 of the phase shifter 300. The VMA may be in the form of a variable gain amplifier. Additionally, a coupled port 318 of the hybrid coupler is directly connected to a second vector modulator amplifier 334. The hybrid coupler may also be coupled to bias circuitry that provides a regulated or controllable bias to the hybrid coupled through an isolated port 314 of the hybrid coupler.

The first vector modulator amplifier 332 and the second vector modulator amplifier 334 pull current through the hybrid coupler 324 during operation. The hybrid coupler 324 transforms the current into DC voltages at the transmitted port 316 and the coupled port 318 using one or more transformers. In this manner, the hybrid coupler 324 acts as a load of the vector modulator 326. The first vector modulator amplifier is designated as I for in-phase signals and the second vector modulator amplifier is designated as Q for quadrature phase signals. The I/Q designations are used throughout for complementary signals.

The coupling circuit 328 is connected to the output port 330 and the vector modulator amplifiers and may be implemented as a transformer, as shown. Alternatively, the coupling circuit 328 may be implemented using a Wilkinson circuit (e.g., a Wilkinson combiner or splitter), a T-junction, a current summing node, a matching network, and so forth. The coupling circuit 328 operates as a combiner in a transmit mode and as a splitter in a receive mode.

During a receive operation, the coupling circuit 328 splits the input receive signal to generate split receive signals that are substantially in-phase with each other (e.g., have relatively similar phases). The vector modulator amplifiers 332, 334 adjust the amplitudes of the split receive signals to generate amplified split receive signals. The hybrid coupler 324 receives a first signal from the first vector modulator amplifier 332 at the transmitted port 316 and a second signal from the second vector modulator amplifier 334 at the coupled port 318 and generates a phase-shifted receive signal at the input port 312 based on the amplified split receive signals. The phase of the phase-shifted receive signal is based on the relative amplitude difference between the amplified split receive signals and a ninety-degree phase offset that is applied via the hybrid coupler 324 to one of the amplified split receive signals. In some embodiments, the phase shifter 300 performs phase shifting for both transmission and reception, and the phase shifter 300 is therefore bidirectional.

For use in a transmit mode, an input transmit signal is applied to the input port 312 of the hybrid coupler 324 of the phase shifter 300. The hybrid coupler 324 generates split transmit signals at the transmitted port 316 and the coupled port 318, respectively. The split transmit signals are approximately ninety degrees out-of-phase with respect to each other and can have relatively similar amplitudes. The vector modulator amplifiers 332, 334 adjust amplitudes of the split transmit signals to generate amplified split transmit signals. The coupling circuit 328 combines the amplified split transmit signals to generate the phase-shifted transmit signal at the output port 330. The phase of the phase-shifted transmit signal at the output port 330 is based on the relative amplitude difference between the amplified split transmit signals and the ninety-degree phase offset between the amplified split transmit signals.

Figure 4:
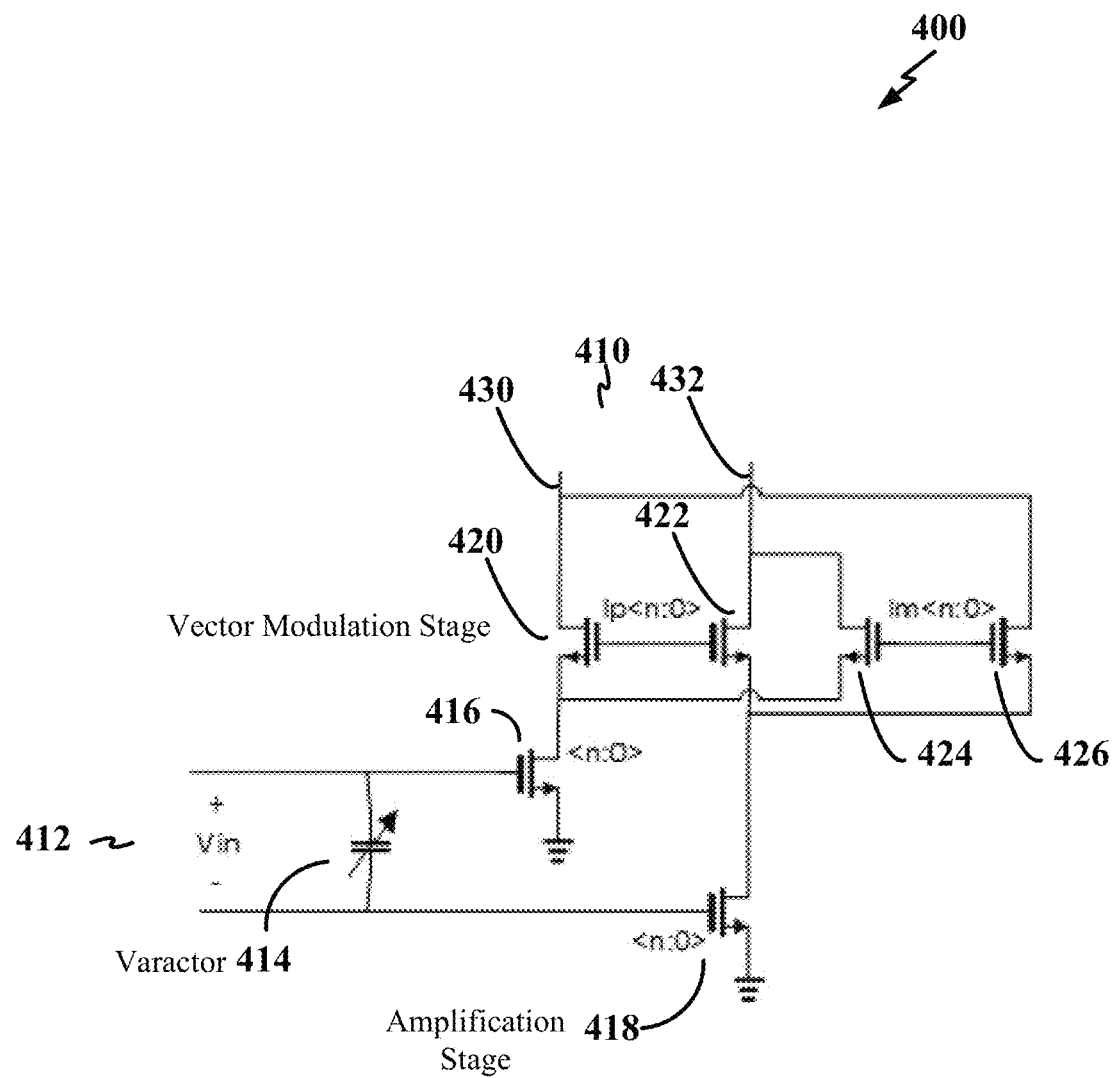
FIG. 4 illustrates a circuit diagram of a vector modulator amplifier in accordance with an aspect of the disclosure.

FIG. 4 is a circuit diagram of a vector modulator amplifier 400 such as the first vector modulator amplifier 332 or the second vector modulator amplifier 334 of FIG. 3. An input port 412 receives a transmitted port or complementary coupled port signal from the hybrid coupler. The signal may be an I signal or a complementary Q signal. The signal is in the form of a modulated voltage and the positive pole is coupled to a gate of a first amplifier transistor 416 and the negative pole is coupled to a gate of a second amplifier transistor 418. The two poles of the inputs are each shown as having a range from n to 0, <n:0> in which n indicates the maximum and 0 indicates the minimum.

A varactor 414 is coupled between the gates of the amplifier transistors 416, 418 to apply a variable capacitor across the two poles e.g. positive and negative poles of the input port 412. The varactor 414 allows a capacitance between the two poles of the input port 412 to be adjusted in response to a capacitance control signal (indicated by the arrow on the capacitor as shown). In some embodiments, the control signal is a digital control signal and the varactor operates digitally. In some embodiments, the varactor is a metal oxide semiconductor (MOS) varactor. MOS varactor compensation with the digital control signal may be used to achieve programmable current reduction. When the capacitance of the varactor is increased there is a gain penalty to the hybrid coupler but the hybrid coupler sees the input impedance as the load that the hybrid circuit sees. When the hybrid coupler splits the signal into I and Q signals, the relative phase, i.e. the quadrature relationship changes in response to changes in the load impedance. The gain penalty may be adjusted for more easily than a change in the quadrature relationship.

In some embodiments, the vector modulator amplifier 400 is implemented in the form of a differential variable gain amplifier. The input port is coupled to a first stage, an amplification stage, with amplifiers in the form of a first amplifier transistor 416 as the positive amplifier and a second amplifier transistor 418, as the negative amplifier which are coupled to a second stage that includes transistors 420, 422, 424, 426 which are coupled to an output port 410 at the respective positive pole 430 of the connected positive drain node and negative pole 432 of the connected drain node of the second stage. The second stage is a vector modulation stage coupled to the amplification stage to receive the amplified voltage to modulate the amplitude and the phase of the components of the received amplified voltage.

In this example, the second stage is implemented using transistors that are in a common-gate configuration, i.e. as gate-connected transistors. As such, a current can flow from one channel terminal of the transistor to another channel terminal of the transistor based on a DC voltage provided via the hybrid coupler 324. The transistors can be implemented using n-channel metal-oxide-semiconductor field-effect transistors (NMOSFETs) or p-channel metal-oxide-semiconductor field-effect transistors (PMOSFETs). In some embodiments, the common-gate configuration is bidirectional. Each amplifier transistor 416, 418 of the first stage and each transistor 420, 422, 424, 426 of the second stage may be symmetrical and in a common gate configuration as gate-connected transistors. Current flow direction is determined by the DC bias voltage provided via the hybrid coupler 324. The first stage and the second stage can implement an input stage or a cascode stage or vice versa to suit the operational mode of the transceiver.

In the example of FIG. 4, a first pair of transistors contains the first amplifier transistor 416 which is connected together as a first cascode amplifier with a first second stage transistor 420 between the input port 412 and the output port 410. The first pair is coupled to the positive pole of the input port 412 and the positive pole 430 of the output. Similarly, a second pair of transistors contains the second amplifier transistor 418 which is also coupled together as a second cascode amplifier with a second stage transistor 422 between the input port 412 and the output port 410. The second pair is connected to the negative pole of the input port and the negative pole of the output port. The first and the second pairs make up the positive section or the in-phase section of the vector modulation stage of the vector modulator amplifier. A third pair of transistors contains the first amplifier transistor 416 which is connected together as a cascode amplifier with a third second stage transistor 424 between the input port 412 and the output port 410. The third pair is coupled to the positive pole of the input and the negative pole 432 of the output port 410. Similarly, a fourth pair of transistors contains the second amplifier transistor 418 which is also coupled together as a cascode amplifier with a fourth second stage transistor 426 between the input port 412 and the output port 410. The fourth pair output is combined with the pair output at the positive pole of the output port. The third and the fourth pairs make up the negative section or quadrature section of the vector modulator stage of the vector modulation amplifier.

Gates of the second stage transistors 420, 422, 424, 426 can be connected to bias circuitry or a voltage generator (not shown), which can provide individual bias voltages. During operation, the bias circuitry can enable different pairs of the transistors to increase, decrease, or invert an amplitude of a signal that propagates between the input port 412 and the output port 410. The first and second pairs have a common gate configuration connected to an lp input with a range from n to 0, lp<n:0>. The third and fourth pairs have a common gate configuration connected to a complementary lm input also with a range from n to 0, lm<n:0>. As an example, if lp, and lm may have 5 bits, then n is 31. By varying the relative amplitude of lp and lm, the phase at the output port 410 is modulated. The amplifier transistors 416, 418 of the first stage control amplitude while the second stage transistors 420, 422, 424, 426 use amplitude to control phase in response to lp, lm. lp and lm act as phase control signals.

In some implementations, the first and third pair of transistors amplifiers each represent a single amplification portion (or slice) of the vector modulator amplifier 400. The second and fourth pair of transistor represent another slice. The vector modulator amplifier can include multiple amplification slices that are implemented together in parallel. For instance. a different slice can be implemented for each bit of a total number of bits at a given resolution level (e.g., five slices for a 5-bit resolution). Each slice can correspond to a different amplification factor, and each slice can be separately activated based on a configuration signal from control circuitry. The slices can be weighted to provide different total amplifications or gains. Example amplification weighting schemes include binary weighting, logarithmic weighting, temperature coding, and so forth. A four-bit control technique can be realized with, for example, 1×, 2×, 4×, and 8× amplification factors for four respective slices. In some cases, the different amplification factors are realized using different quantities of transistors or different sizes of transistors.

As a quadrature generating circuit, the vector modulation stage of the vector modulator amplifier has an in-phase input between the two connected inputs of the in-phase section and a quadrature input between the two connected gates of the quadrature section. lp is the in-phase control signal to the in-phase section and lm is the quadrature control input to the quadrature section. These inputs control the operation of the vector modulation stage as described above and may also be used to determine a control value for the capacitance control signal to the varactor. In one example the two control signals lp, lm are combined by a varactor controller. When the in-phase control signal is a digital value and the quadrature control signal is a digital value, then the two control signals may be combined with a digital OR operation applied to the two digital values. By using an OR operation of the lp and lm control signals, the capacitance is varied in direct response to changes in the operation of the vector modulation section. With the OR, or other suitable operation, the capacitance control signal causes the varactor to compensate impedance changes of the vector modulation stage. The processor 296 of the transceiver 220 may host the varactor controller or other logic may be provided. The processor 296 may determine the control signals and perform any logical operations on any of the signals. The processor may be coupled to the hybrid coupler, and any amplifiers, including the vector modulator amplifier.

A digital logic circuit, e.g. the processor 296, provides for programmable power modes and computes all the settings for "Low Power Mode" or conversely disables the varactor, e.g. using a capacitance control signal of 0, and sets the codes that correspond to "High Performance Mode." There may be additional programmable power modes. The disabled varactor, disabling a capacitive connection between the first input and the second input, may correspond to an input control value of 0 instead of a combination of lp and lm. The varactor, which may be a digital varactor, provides a constant impedance no matter the number of branches or slices that are operated in the vector modulator amplifier 400. For instance, in a configuration with n slices and the number of active slices may be any number from n to 0, there will be one impedance if all slices are active. When a channel is disabled, for example a quadrature channel to drive the phase to zero degrees, then the amplification transistors present a different input impedance. The digital varactor is configured to change the capacitance in response to the varactor control signal to present a constant input impedance with any number of active slices and also to reduce the current pull through the hybrid coupler 324. As a result, the phase shifter uses programmable power modes to improve efficiency and performance.

Figure 5:
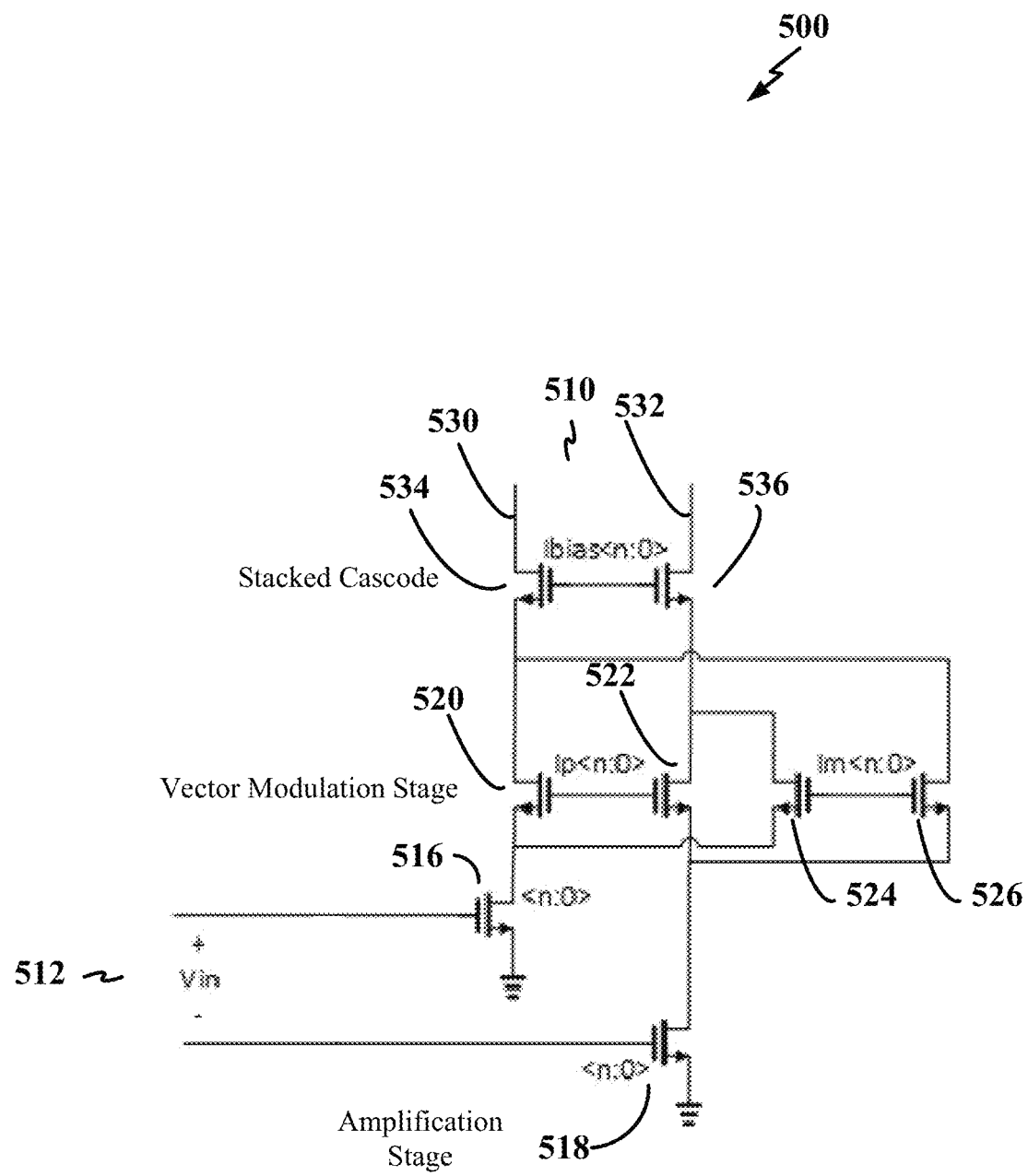
FIG. 5 illustrates a circuit diagram of an alternate vector modulator amplifier in accordance with another aspect of the disclosure.

FIG. 5 is a circuit diagram of an alternative vector modulator amplifier 500 such as the first vector modulator amplifier 332 or the second vector modulator amplifier 334 of FIG. 3. An input port 512 receives a transmitted port or complementary coupled port signal from the hybrid coupler 324. The signal is in the form of a modulated voltage and the positive pole is coupled to a gate of a first amplifier transistor 516 and the negative pole is coupled to a gate of a second amplifier transistor 518. The two poles of the inputs are each shown as having a range from n to 0, <n:0>. The vector modulator amplifier has a second stage with four cascode transistors 520, 522, 524, 526 each coupled to one of the amplifier transistors 515, 518 each in a cascode amplifier configuration. The outputs are connected to form an output port 510 with a positive output node 530 and a negative output node 532. The second stage transistors are paired with common gates between the first cascode transistor 520 and the second cascode transistor 522 coupled to an lp<n:0> control input and common gates between the third cascode transistor 524 and the fourth cascode transistor 526 coupled to an lp<n:0> control input.

An additional stacked cascode is formed of a first stacked cascode transistor 534 with a source coupled to a junction of a drain of the first cascode transistor 520 and the drain of the fourth cascode transistor 526. The drains of the first and fourth cascode transistors are connected for the positive output node 530 of the vector modulation stage. The stacked cascode has a second stacked cascode transistor 536 with a source coupled to a junction of the drain of the second cascode transistor 522 and the drain of the third cascode transistor 524. The output port 510 is taken from the drains of the stacked cascode transistors 534, 536. The stacked cascode adds an additional and third stage to the vector modulator amplifier and reduces the total output capacitance.

The inner set of cascode transistors 520, 522, 524, 526 make up the second stage or vector modulation stage and select phase using the relative amplitude of the in-phase and quadrature signals as in the example of FIG. 4. The gates of the in-phase section including cascode transistors 520, 522 are coupled to lp<n:0>. The gates of the quadrature section including cascode transistors 524, 526 are coupled to lm<n:0>. The gates of the stacked cascode transistors 534, 536 are coupled to an l bias source, lbias<n:0> as gate-connected transistors. In contrast to double cascode, super cascode, or two cascode configurations, in the illustrated configuration, l bias, lm, and lp are all biased off the same voltage source. lm and lp are complementary. l bias is the same voltage as the pair of gate-connected transistors to which it is attached, e.g. lp. This renders the structure to effectively be one single cascode with an increased channel length. The stacked cascode is equivalent to a single cascode with a larger L effective.

Attaching a second stacked cascode but using the same bias reduces the amplifier capacitance which allows the amplifier to achieve higher frequencies. More transistors are needed for each vector modulator amplifier slice and these transistors all have a parasitic capacitance. By stacking the transistors and using the same bias voltage, the combination behaves like a single cascode with a longer gate length. By contrast a second cascode would require more headroom and not provide the high frequency benefits.

Figure 6:
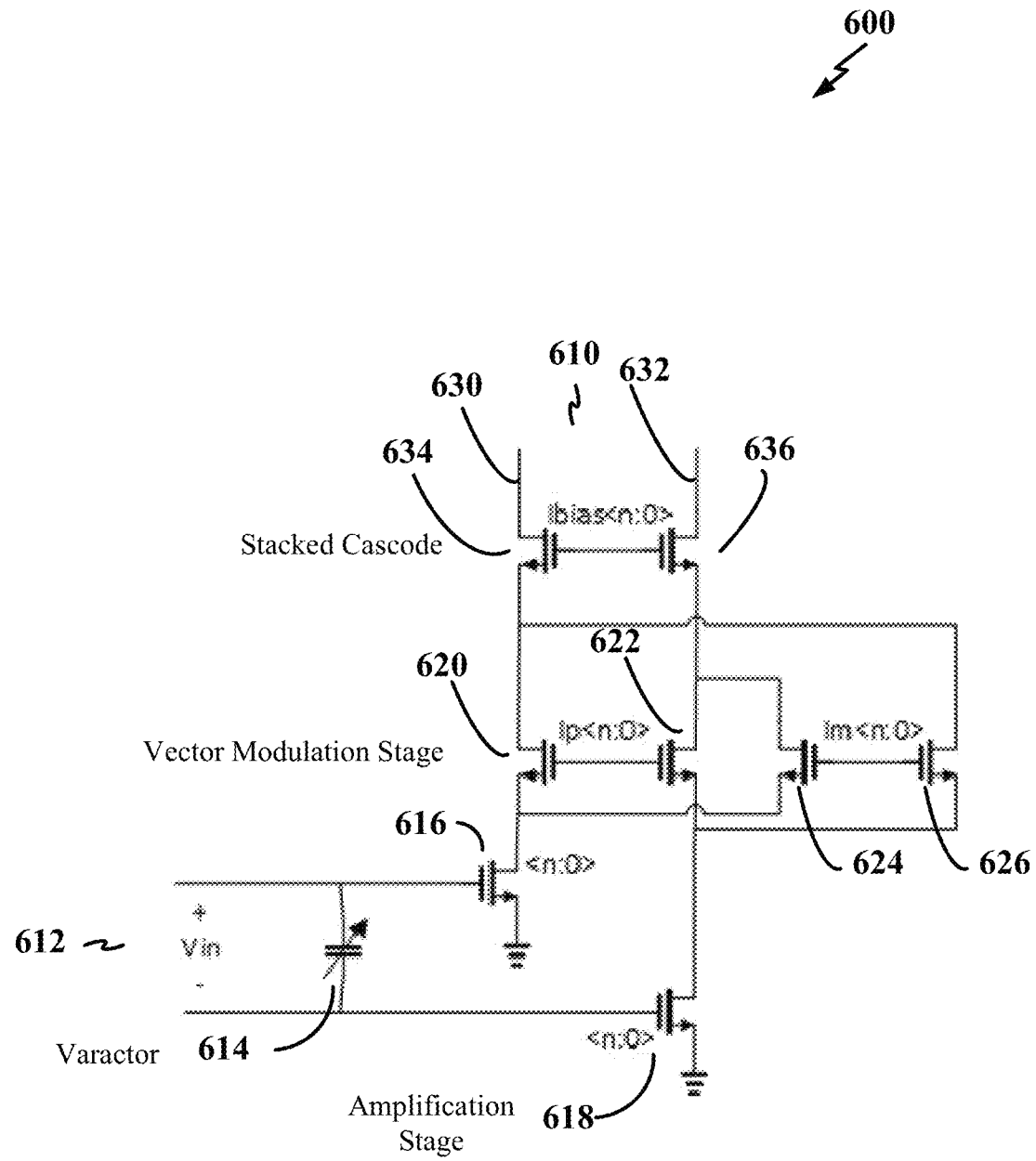
FIG. 6 illustrates a circuit diagram of a further alternate vector modulator amplifier in accordance with another aspect of the disclosure.

FIG. 6 is a circuit diagram of a further alternative vector modulator amplifier 600 such as the first vector modulator amplifier 332 or the second vector modulator amplifier 334 of FIG. 3. This alternative configuration combines the benefit of an input varactor 614 with third stage stacked cascode transistors 634, 636. An input port 612 receives a transmitted port or complementary coupled port signal from the hybrid coupler. The positive pole is coupled to a gate of a first amplifier transistor 616 and the negative pole is coupled to a gate of a second amplifier transistor 618. The vector modulator amplifier has a second stage or vector modulation stage with four transistors 620, 622, 624, 626 each coupled to one of the amplifier transistors 616, 618 each in a cascode amplifier configuration. The outputs of the second stage are connected and coupled through the third stage stacked cascode transistors 634, 636 to form an output port 610 with a positive node 630 and a negative node 632. Two second stage transistors are paired in an in-phase section with common gates between the first transistor 620 and the second transistor 622 coupled to an lp<n:0> control input. The two other transistors are paired in a quadrature section with common gates between the third transistor 624 and the fourth transistor 526 coupled to an lp<n:0> control input. The gates of the stacked cascode transistors are similarly connected to each other and biased in the same way to l bias, which in this case is matched to lp.

The input varactor 614 is coupled across the first input and the second input of the amplification stage. In particular the varactor is coupled between the gates of the two amplification stage amplifier transistors 616, 618. The varactor adjusts the capacitance between the first input and the second input in response to a capacitance control signal from a varactor controller, e.g. a processor or other logic circuit.

Figure 7:
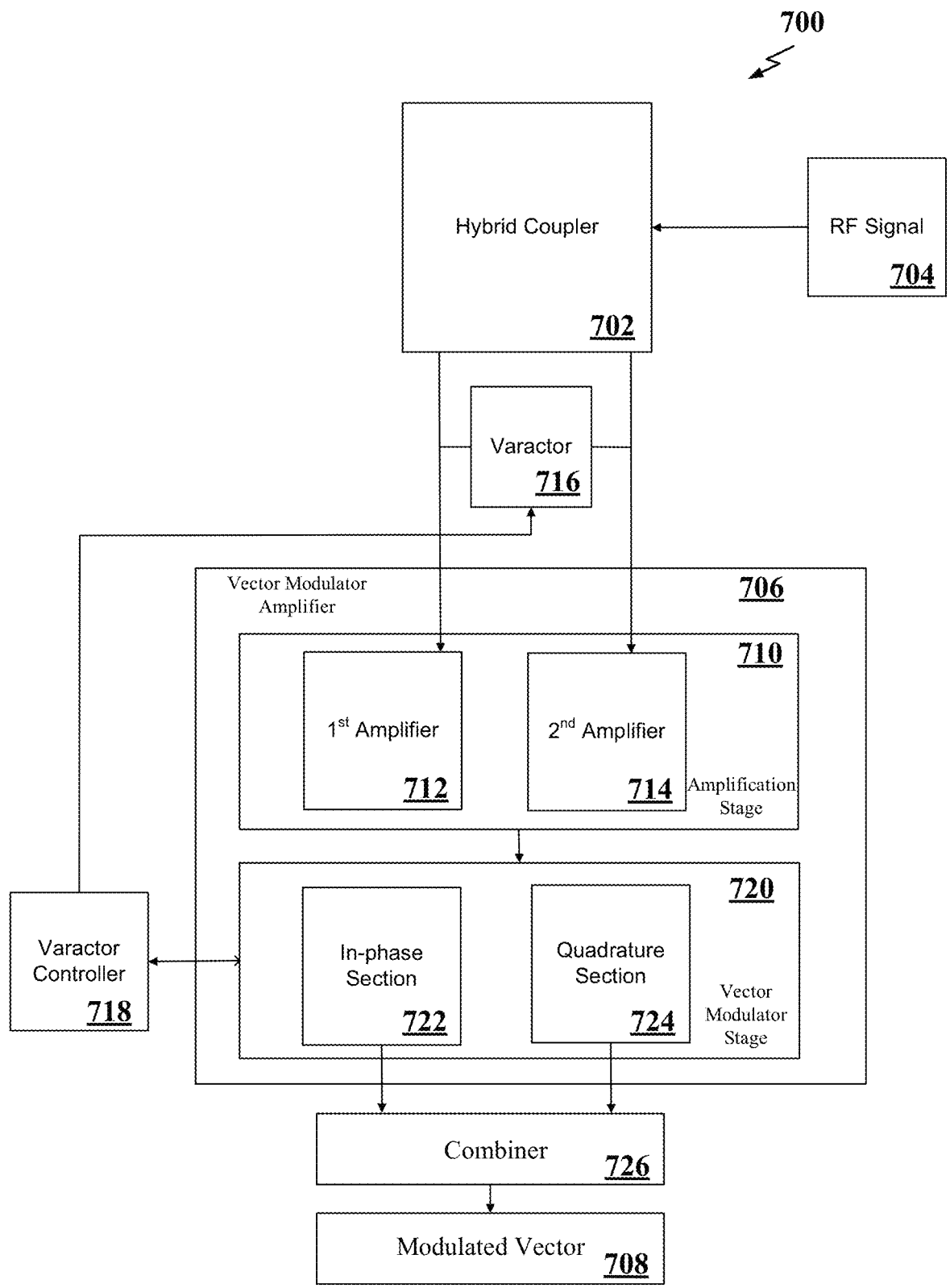
FIG. 7 illustrates a block diagram of a radio frequency phase shifter in accordance with an aspect of the disclosure.

FIG. 7 illustrates a block diagram of a radio frequency phase shifter 700, the components of which are illustrated in the various other diagrams herein. A hybrid coupler 702 generates a first output and a complementary second output in response to a received RF signal 704. A low noise amplifier (see e.g. FIG. 8 at 804) is coupled to an antenna element (see e.g. FIG. 8 at 802) to receive an RF signal. The low noise amplifier is coupled to the hybrid coupler 702 to amplify the RF signal and provide it to the hybrid coupler as the received RF signal.

A vector modulator amplifier 706 has an amplification stage 710 and a vector modulator stage 720. The amplification stage produces an amplified voltage. The amplification stage has a first amplifier 712 with a first input coupled to the first output of the hybrid coupler 702 and a second amplifier 714 with a complementary second input coupled to the complementary second output of the hybrid coupler 702. The vector modulation stage 720 is coupled to the amplification stage 710 to receive the amplified voltage and to produce a modulated vector 708. The vector modulation stage 720 has an in-phase section 722 and a quadrature section 724 to control a phase of the modulated vector in response to a phase control signal.

A varactor 716 is coupled across the first input and the second input of the amplification stage 710. The varactor adjusts a capacitance between the first input and the second input in response to a capacitance control signal from a varactor controller 718.

A combiner 726 combines an output of the in-phase section 722 and an output of the quadrature section 724 of the vector modulation stage 720 of the vector modulator amplifier 706 to generate a modulated vector 708.

The varactor controller 718 is coupled to the varactor 716 to generate the capacitance control signal in response to a phase control signal, which may be in the form of digital phase codes. It may also respond to a programmable power mode instruction. The varactor controller 718 may be a digital logic circuit and may be incorporated into a unit of the processor 296. The varactor controller 718 may provide multiple programmable power modes. In a high performance mode, the phase shifter 700 may support a legacy operation in which the varactor 716 is set to zero or no capacitance. This may be done using the capacitor control signal at 0, disable, or a similar value. Another programmable power mode is a low power mode in which the lp and lm values may be used by the varactor controller 718 to determine a capacitance setting for the varactor 716. lp is the in-phase control signal to the in-phase section 722 and lm is the quadrature control input to the quadrature section 724. These may be provided by the connected varactor controller 718 or another controller. These inputs control the operation of the vector modulation stage 720 as described above. The varactor controller 718 provides a suitable high performance low power mode capacitor control signal to the varactor 716. In some embodiments, the logic of the varactor controller converts the digital phase codes to automatically reduce $I_{DD}$ and provide varactor compensation so that the input impedance stays constant across phase settings made by the digital phase codes. As a result, the low power mode may have similar RF performance and characteristics of the high performance mode with significant current reduction.

Figure 8:
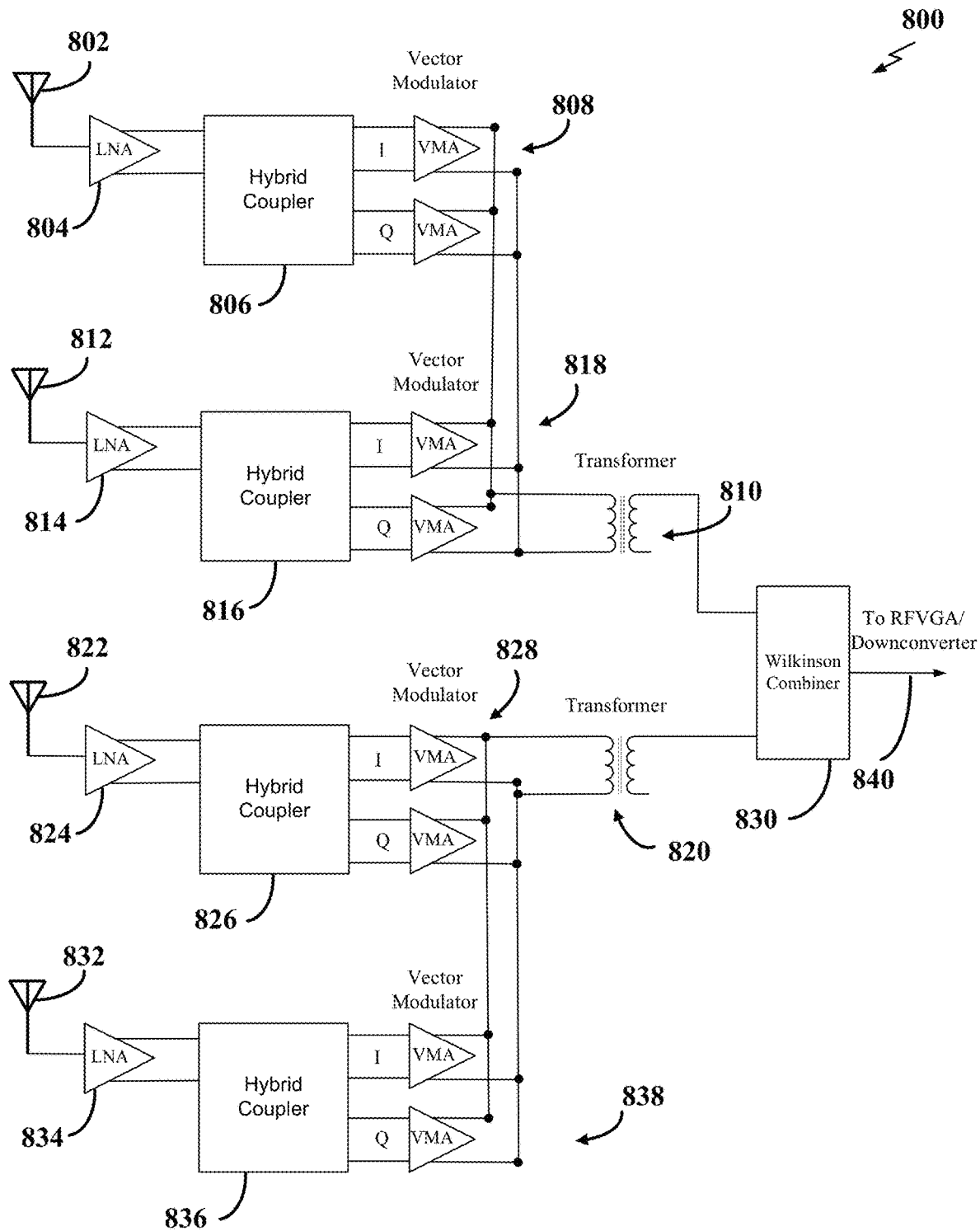
FIG. 8 illustrates a block diagram of four phase shifters connected to receive radio frequency signals in accordance with an aspect of the disclosure.

FIG. 8 is a block diagram of four phase shifters connected to receive RF signals from elements of a phased array antenna or a portion of a phased array antenna. The antenna elements may be included in a die or in a package that includes the other components shown or some or all of the antenna elements may be external. A first antenna element 802 conducts an RF signal to a first LNA (Low Noise Amplifier). The first LNA 804 sends an amplified RF signal to a hybrid coupler 806 which generates transmitted and coupled outputs each to a set of two vector modulator amplifiers 808. A second antenna element 812 conducts a second RF signal to a second LNA 814. The LNA sends an amplified RF signal to a second hybrid coupler 816 which generates transmitted and coupled outputs each to a second set of two vector modulator amplifiers 818. Typically, but not necessarily the first and the second RF signal are the same but received at different times, i.e. shifted in phase. The output of the first set of vector modulator amplifiers 808 is a first modulated vector and the output of the second set of vector modulator amplifiers 818 is a second modulated vector. A combiner in the form of a coupling port 810 combines the first modulated vector and the second modulated vector. Four positive pole outputs are summed and four negative pole outputs are summed. The allows the vector modulator amplifier to emphasize or deemphasize a received RF signal that has a particular phase relationship to the antenna elements 802, 812. The summed outputs are applied to an output coupler 810 for differential to single-ended conversion with a single output.

Similarly, a third antenna element 822 and a fourth antenna element 832 receive RF signals and are each coupled to respective LNAs 824, 834, which are coupled to respective hybrid couplers 826, 836. The hybrid couplers 826, 836 feed complementary RF signals into respective sets of vector modulator amplifiers 828, 838 the outputs of which are summed into a coupling port 820 in the same manner as with the first output coupler 810. The two coupling port signals, the output of the first coupling port 810 and the output of the second coupling port 820, are fed to a Wilkinson combiner 830 or another similar device. The combined outputs are combined into a single RF output 840. This signal is provided to RF variable gain amplifiers, downconverters, and other systems (not shown). This allows signals from multiple antenna elements to be combined with suitable phase relationships, as applied by the vector modulators under external control, e.g. by a processor or logic circuit, to recover an RF signal with receive beamsteering. Similar structures and techniques may be applied to a transmit stage to apply power to the antennas to send RF signal with transmit beamsteering.

Figure 9:
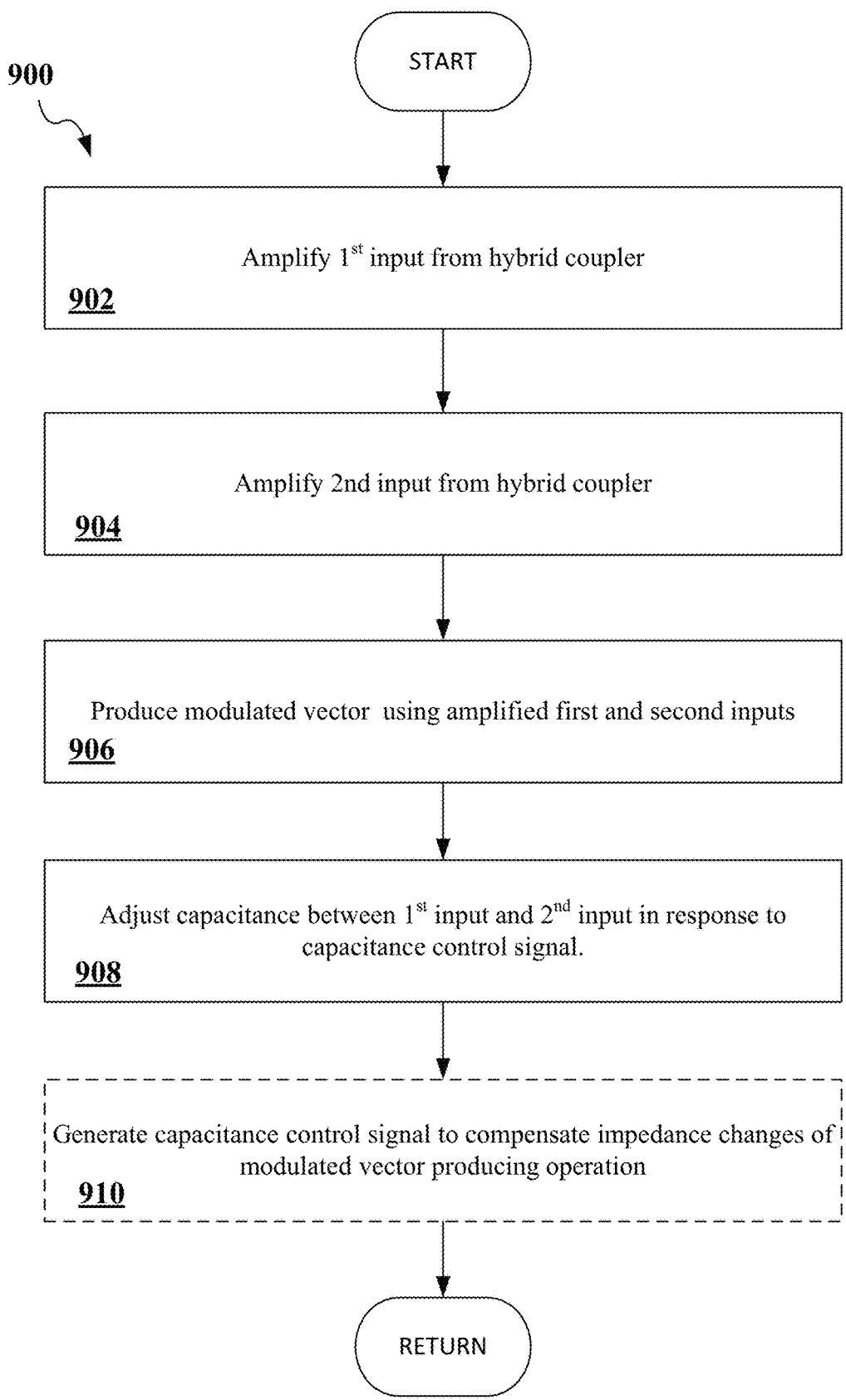
FIG. 9 illustrates a flow diagram of an example method of operating a phase shifter in accordance with another aspect of the disclosure.

FIG. 9 is a flow chart describing an example of the operation of a method for shifting the phase of an input RF signal. The blocks in the method 900 can be performed in or out of the order shown, and in some embodiments, can be performed at least in part in parallel. The process repeats in a continuous operation during operation of the system. In block 902, a first input coupled to a first output of a hybrid coupler is amplified in an amplification stage to produce an amplified voltage. In block 904, a second input coupled to a second output of the hybrid coupler is amplified in the amplification stage to produce a second amplified voltage. The first input and the complementary second input are complementary to each other and produced by the hybrid coupler based on an input RF signal or an upconverted signal to be transmitted.

In block 906, a modulated vector is produced using the first amplified voltage and the second amplified voltage. The operations include receiving the first amplified voltage and receiving the second amplified voltage at a vector modulation stage that is coupled to the amplification stage. The vector modulation stage has an in-phase section and a quadrature section to control the phase of the modulated vector in response to a phase control signal.

In block 908, the capacitance is adjusted between the first input and the second input at a varactor coupled across the first input and the second input of the amplification stage in response to a capacitance control signal.

The capacitance control signal may be generated in different ways and for different purposes to suit different implementations. In block 910, optionally, the capacitance control signal is generated to compensate impedance changes of the vector modulation stage. In some embodiments, an in-phase control signal controls the amplification of an in-phase section of the vector modulation stage. A quadrature control signal controls the amplification of the quadrature section. In some embodiments, the capacitance control signal is generated by combining the in-phase control signal and the quadrature control signal. The signal may be combined by applying an OR operation or other operation.

In some embodiments the in-phase control signal is a bias voltage and the method includes biasing common gates of the in-phase section with the in-phase control signal. In some embodiments, the quadrature control signal is a bias voltage and the method includes biasing common gates of the quadrature section with the quadrature control signal.

In some embodiments, producing the modulated vector further includes producing the modulated vector through a cascode circuit coupled to the vector modulation stage and biasing transistor gates of the cascode circuit with a common bias voltage.

Figure 10:
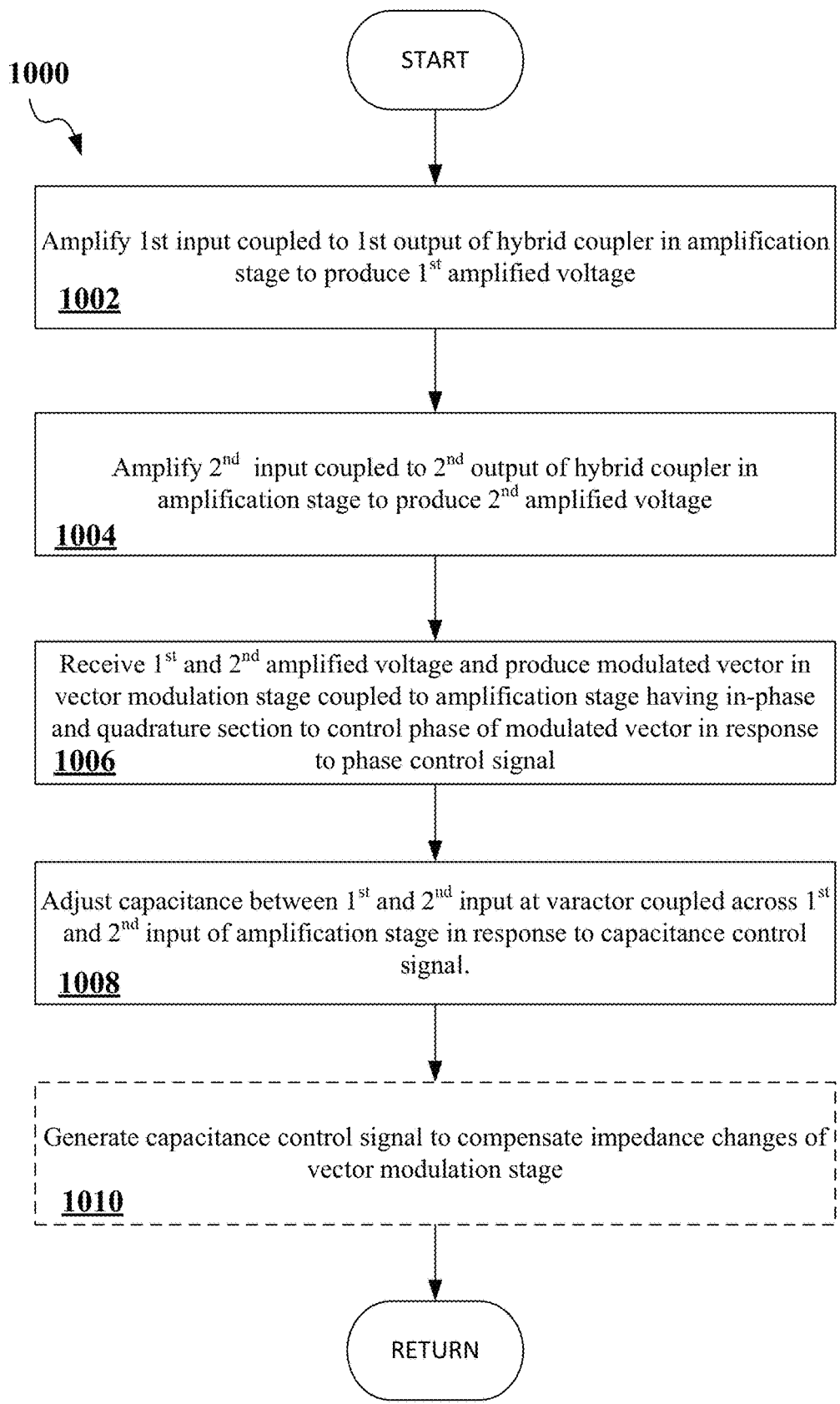
FIG. 10 illustrates an alternative flow diagram of an example method of operating a phase shifter in accordance with another aspect of the disclosure.

FIG. 10 is an alternative flow chart describing an example of the operation of a method for shifting the phase of an input RF signal. The blocks in the method 1000 can be performed in or out of the order shown, and in some embodiments, can be performed at least in part in parallel. The process repeats in a continuous operation during operation of the system. In block 1002, a first input coupled to a first output of a hybrid coupler is amplified in an amplification stage to produce a first amplified voltage. In block 1004, a second input coupled to a second output of the hybrid coupler is amplified in the amplification stage to produce a second amplified voltage. The first input and the complementary second input are complementary to each other and produced by the hybrid coupler based on an input RF signal or an upconverted signal to be transmitted.

In block 1006, the first amplified voltage and the second amplified voltage are received and a modulated vector is produced in a vector modulation stage coupled to the amplification stage having an in-phase section and a quadrature section to control a phase of the modulated vector in response to a phase control signal.

In block 1008, the capacitance is adjusted between the first input and the second input at a varactor coupled across the first input and the second input of the amplification stage in response to a capacitance control signal.

At 1010, a capacitance control signal is optionally generated to compensate impedance changes of the vector modulation stage.

Figure 11:
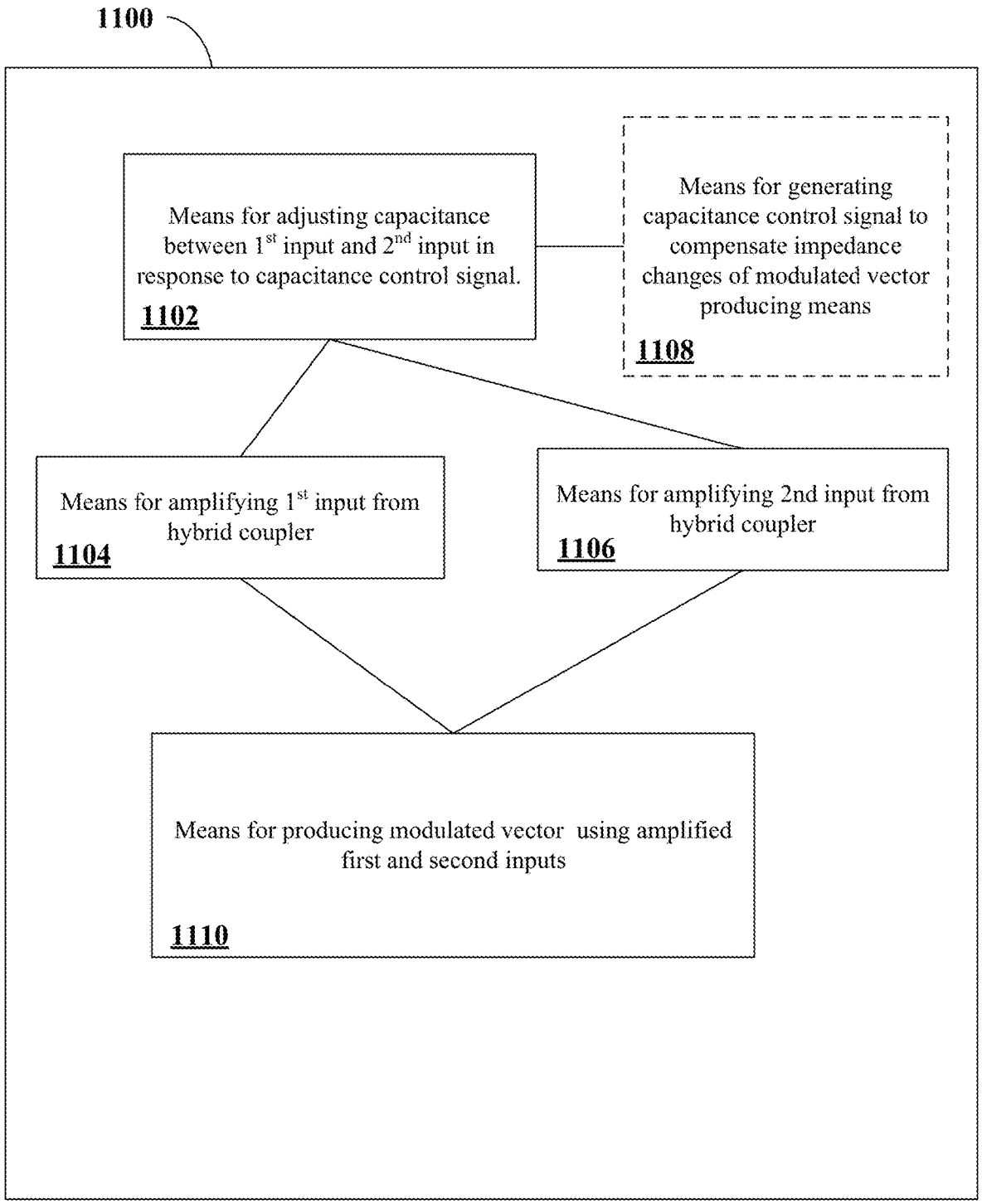
FIG. 11 illustrates a block diagram of an example vector modulator amplifier in accordance with an aspect of the disclosure.

FIG. 11 is a functional block diagram of an example apparatus for shifting the phase of an input RF signal. The apparatus 1100 comprises means 1104 for amplifying a first input coupled to a first output of a hybrid coupler to produce an amplified voltage. The apparatus further includes means 1106 for amplifying a second output of the hybrid coupler to produce a second amplified voltage. The first input and the second input are complementary and produced by the hybrid coupler based on an input RF signal or an upconverted signal to be transmitted.

The apparatus further includes means 1110 for producing a modulated vector using the first amplified voltage and the second amplified voltage. The first amplified voltage and the second amplified voltage are received from the means for amplifying the first input and the means for amplifying the second input. In some embodiments, an in-phase section and a quadrature section control the phase of the modulated vector in response to a phase control signal.

The apparatus further includes means 1102 for adjusting the capacitance between the first input and the second input in response to a capacitance control signal. The capacitance control signal may be generated in different ways and for different purposes to suit different implementations. The apparatus, optionally includes means 1108 for generating the capacitance control signal to compensate impedance changes of the modulated vector producing means. In some embodiments, an in-phase control signal controls the amplification of an in-phase section of the vector modulation stage. A quadrature control signal controls the amplification of a quadrature section. In some embodiments, the capacitance control signal is generated by combining the in-phase control signal and the quadrature control signal. The signal may be combined using an OR operation or other operation.

The circuit architecture described herein may be implemented on one or more integrated circuits (ICs), analog ICs, RFICs, mixed-signal ICs, application specific integrated circuits (ASICs), printed circuit boards (PCBs), electronic devices, etc. The circuit architecture described herein may also be fabricated with various process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

As used herein, "couple," "coupled," or "coupling" refers to a relationship between two or more components that are in operative communication magnetically, electromagnetically, or by being electrically connected to implement some feature or realize some capability that is described. The term "connect," "connected," or "connecting" refers to an electrical connection using a physical line, such as a metal trace or wire. In some cases, the electrical connection is provided using a capacitor. A connection can include a direct connection or an indirect connection. A direct connection refers to connecting discrete circuit elements via a same node without an intervening element. An indirect connection refers to connecting discrete circuit elements via one or more other devices or other discrete circuit elements.

An apparatus implementing the circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) ASICs such as a mobile station modem (MSM), (v) a module that may be embedded within other devices, (vi) a receiver, cellular phone, wireless device, handset, or mobile unit, (vii) etc.

The following provides an overview of aspects of the present disclosure:

Aspect 1: An apparatus comprising: an amplification stage to produce an amplified voltage, the amplification stage having a first amplifier with a first input coupled to a first output of a hybrid coupler and a second amplifier with a complementary second input coupled to a complementary second output of the hybrid coupler; a vector modulation stage coupled to the amplification stage to receive the amplified voltage and to produce a modulated vector, the vector modulation stage having an in-phase section and a quadrature section to control a phase of the modulated vector in response to a phase control signal; and a varactor coupled across the first input and the second input of the amplification stage, the varactor adjusting a capacitance between the first input and the second input in response to a capacitance control signal.

Aspect 2: The apparatus of aspect 1, wherein the varactor is configured to operate in a high performance mode by disabling the capacitance between the first input and the second input.

Aspect 3: The apparatus of aspect 1 or 2, further comprising a varactor controller coupled to the varactor to generate the capacitance control signal.

Aspect 4: The apparatus of aspect 3, wherein the varactor controller combines an in-phase control signal of the in-phase section of the vector modulation stage and a quadrature control signal of the quadrature section of the vector modulation stage to generate the capacitance control signal.

Aspect 5: The apparatus of aspect 4, wherein the in-phase control signal is a digital value and the quadrature control signal is a digital value and wherein the varactor controller generates the capacitance control signal by applying an OR operation to the in-phase control signal and the quadrature control signal.

Aspect 6: The apparatus of any one or more of aspects 3-5, wherein the varactor controller generates the capacitance control signal to compensate impedance changes of the vector modulation stage.

Aspect 7: The apparatus of any one or more of aspects 1-6, wherein the in-phase section of the vector modulation stage comprises a first cascode amplifier coupled to the amplification stage and the quadrature section of the vector modulation stage comprises a second cascode amplifier coupled to the same amplification stage.

Aspect 8: The apparatus of aspect 7, wherein first cascode amplifier comprises common gates coupled to a bias voltage.

Aspect 9: The apparatus of aspect 7 or 8, wherein the in-phase section of the vector modulation stage comprises a stacked cascode over the first cascode amplifier and the second cascode amplifier, the stacked cascode having gate-connected transistors coupled to the same bias voltage as the first cascode amplifier.

Aspect 10: A radio frequency (RF) phase shifter comprising: a hybrid coupler to generate a first output and a complementary second output in response to a received RF signal; a vector modulator amplifier having an amplification stage to produce an amplified voltage, the amplification stage having a first amplifier with a first input coupled to the first output of the hybrid coupler and a second amplifier with a complementary second input coupled to the complementary second output of the hybrid coupler, a vector modulation stage coupled to the amplification stage to receive the amplified voltage and to produce a modulated vector, the vector modulation stage having an in-phase section and a quadrature section to control a phase of the modulated vector in response to a phase control signal, and a varactor coupled across the first input and the second input of the amplification stage, the varactor adjusting a capacitance between the first input and the second input in response to a capacitance control signal; a combiner to combine an output of the in-phase section and an output of the quadrature section and to generate a modulated vector; and a varactor controller coupled to the varactor to generate the capacitance control signal in response to a phase control signal.

Aspect 11: The RF phase shifter of aspect 10, further comprising a low noise amplifier coupled to an antenna element to receive an RF signal, the low noise amplifier further being coupled to the hybrid coupler to amplify the RF signal and provide it to the hybrid coupler as the received RF signal.

Aspect 12: The RF phase shifter of aspect 10 or 11, further comprising a second hybrid coupler and vector modulator amplifier, to generate a second modulated vector and wherein the combiner comprises a coupling port having a transformer to combine the first modulated vector and the second modulated vector.

Aspect 13: The RF phase shifter of aspect 12, further comprising a downconverter and a Wilkinson combiner coupled to the downconverter, coupled to an output of the coupling port, and coupled to an output of a second coupling port to combine the outputs and provide the combined outputs to the downconverter.

Aspect 14: A method comprising: amplifying a first input coupled to a first output of a hybrid coupler in an amplification stage to produce a first amplified voltage; amplifying a second input coupled to a second output of the hybrid coupler in the amplification stage to produce a second amplified voltage, wherein the first input and the second input are complementary; receiving the first amplified voltage and the second amplified voltage and producing a modulated vector in a vector modulation stage coupled to the amplification stage having an in-phase section and a quadrature section to control a phase of the modulated vector in response to a phase control signal; and adjusting a capacitance between the first input and the second input at a varactor coupled across the first input and the second input of the amplification stage in response to a capacitance control signal.

Aspect 15: The method of aspect 14, further comprising operating in a high performance mode at the varactor by disabling a capacitive connection between the first input and the second input.

Aspect 16: The method of aspect 14 or 15, further comprising combining an in-phase control signal of the in-phase section of the vector modulation stage and a quadrature control signal of the quadrature section of the vector modulation stage to generate the capacitance control signal.

Aspect 17: The method of aspect 16, wherein the in-phase control signal controls the amplification of the in-phase section and the quadrature control signal controls the amplification of the quadrature section.

Aspect 18: The method of aspect 16 or 17, wherein the in-phase control signal is a digital control signal and the quadrature control signal is a digital control signal and wherein generating the capacitance control signal comprises applying an OR operation to the in-phase control signal and the quadrature control signal.

Aspect 19: The method of any one or more of aspects 16-18, wherein generating the capacitance control signal is to compensate impedance changes of the vector modulation stage.

Aspect 20: The method of any one or more of aspects 14-19, further comprising biasing transistor gates of the in-phase section in the vector modulation stage with an in-phase control signal and biasing transistor gates of the quadrature section in the vector modulation stage with a quadrature control signal.

Aspect 21: The method of aspect 20, wherein producing the modulated vector comprises producing the modulated vector through a cascode coupled to the vector modulation stage and biasing transistor gates of the cascode with a common bias voltage.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

Although selected aspects have been illustrated and described in detail, it will be understood that various substitutions and alterations may be made to the described embodiments, as defined by the following claims

What is claimed:

1. An apparatus comprising:
an amplification stage to produce an amplified voltage, the amplification stage having a first amplifier with a first input coupled to a first output of a hybrid coupler and a second amplifier with a complementary second input coupled to a complementary second output of the hybrid coupler;
a vector modulation stage coupled to the amplification stage to receive the amplified voltage and to produce a modulated vector, the vector modulation stage having an in-phase section and a quadrature section to control a phase of the modulated vector in response to a phase control signal;
a varactor coupled across the first input and the second input of the amplification stage, the varactor adjusting a capacitance between the first input and the second input in response to a capacitance control signal; and
a varactor controller coupled to the varactor to generate the capacitance control signal.

2. The apparatus of claim 1, wherein the varactor is configured to operate in a high performance mode by disabling the capacitance between the first input and the second input.

3. The apparatus of claim 1, wherein the varactor controller combines an in-phase control signal of the in-phase section of the vector modulation stage and a quadrature control signal of the quadrature section of the vector modulation stage to generate the capacitance control signal.

4. The apparatus of claim 3, wherein the in-phase control signal is a digital value and the quadrature control signal is a digital value and wherein the varactor controller generates the capacitance control signal by applying an OR operation to the in-phase control signal and the quadrature control signal.

5. The apparatus of claim 1, wherein the varactor controller generates the capacitance control signal to compensate impedance changes of the vector modulation stage.

6. The apparatus of claim 1, wherein the in-phase section of the vector modulation stage comprises a first cascode amplifier coupled to the amplification stage and the quadrature section of the vector modulation stage comprises a second cascode amplifier coupled to the same amplification stage.

7. The apparatus of claim 6, wherein first cascode amplifier comprises common gates coupled to a bias voltage.

8. The apparatus of claim 6, wherein the in-phase section of the vector modulation stage comprises a stacked cascode over the first cascode amplifier and the second cascode amplifier, the stacked cascode having gate-connected transistors coupled to the same bias voltage as the first cascode amplifier.

9. A radio frequency (RF) phase shifter comprising:
a hybrid coupler to generate a first output and a complementary second output in response to a received RF signal;
a vector modulator amplifier having an amplification stage to produce an amplified voltage, the amplification stage having a first amplifier with a first input coupled to the first output of the hybrid coupler and a second amplifier with a complementary second input coupled to the complementary second output of the hybrid coupler, a vector modulation stage coupled to the amplification stage to receive the amplified voltage and to produce a modulated vector, the vector modulation stage having an in-phase section and a quadrature section to control a phase of the modulated vector in response to a phase control signal, and a varactor coupled across the first input and the second input of the amplification stage, the varactor adjusting a capacitance between the first input and the second input in response to a capacitance control signal;
a combiner to combine an output of the in-phase section and an output of the quadrature section and to generate a modulated vector; and
a varactor controller coupled to the varactor to generate the capacitance control signal in response to a phase control signal.

10. The RF phase shifter of claim 9, further comprising a low noise amplifier coupled to an antenna element to receive an RF signal, the low noise amplifier further being coupled to the hybrid coupler to amplify the RF signal and provide it to the hybrid coupler as the received RF signal.

11. The RF phase shifter of claim 9, further comprising a second hybrid coupler and vector modulator amplifier, to generate a second modulated vector and wherein the combiner comprises a coupling port having a transformer to combine the first modulated vector and the second modulated vector.

12. The RF phase shifter of claim 11, further comprising a downconverter and a Wilkinson combiner coupled to the downconverter, coupled to an output of the coupling port, and coupled to an output of a second coupling port to combine the outputs and provide the combined outputs to the downconverter.

13. A method comprising:
amplifying a first input coupled to a first output of a hybrid coupler in an amplification stage to produce a first amplified voltage;
amplifying a second input coupled to a second output of the hybrid coupler in the amplification stage to produce a second amplified voltage, wherein the first input and the second input are complementary;
receiving the first amplified voltage and the second amplified voltage and producing a modulated vector in a vector modulation stage coupled to the amplification stage having an in-phase section and a quadrature section to control a phase of the modulated vector in response to a phase control signal;
adjusting a capacitance between the first input and the second input at a varactor coupled across the first input and the second input of the amplification stage in response to a capacitance control signal; and
operating in a high performance mode at the varactor by disabling a capacitive connection between the first input and the second input.

14. The method of claim 13, further comprising combining an in-phase control signal of the in-phase section of the vector modulation stage and a quadrature control signal of the quadrature section of the vector modulation stage to generate the capacitance control signal.

15. The method of claim 14, wherein the in-phase control signal controls the amplification of the in-phase section and the quadrature control signal controls the amplification of the quadrature section.

16. The method of claim 14, wherein the in-phase control signal is a digital control signal and the quadrature control signal is a digital control signal and wherein generating the capacitance control signal comprises applying an OR operation to the in-phase control signal and the quadrature control signal.

17. The method of claim 14, wherein generating the capacitance control signal is to compensate impedance changes of the vector modulation stage.

18. The method of claim 13, further comprising biasing transistor gates of the in-phase section in the vector modulation stage with an in-phase control signal and biasing transistor gates of the quadrature section in the vector modulation stage with a quadrature control signal.

19. The method of claim 18, wherein producing the modulated vector comprises producing the modulated vector through a cascode coupled to the vector modulation stage and biasing transistor gates of the cascode with a common bias voltage.

* * * * *